(12) United States Patent
Lo et al.

(10) Patent No.: US 7,095,476 B2
(45) Date of Patent: Aug. 22, 2006

(54) LIQUID CRYSTAL MODULE

(75) Inventors: Chin-Wen Lo, Taichung (TW);
Ming-Chuan Lin, Taichung (TW);
Wei-Wen Hsueh, Taichung (TW);
Yu-Jen Tsai, Taichung (TW)

(73) Assignee: Wintek Corporation, Taichung (TW)

( * ) Notice: Subject to any disclaimer, the term of this patent is extended or adjusted under 35 U.S.C. 154(b) by 82 days.

(21) Appl. No.: 10/964,765

(22) Filed: Oct. 15, 2004

(65) Prior Publication Data

US 2006/0082715 A1   Apr. 20, 2006

(51) Int. Cl.
*G02F 1/1345* (2006.01)
(52) U.S. Cl. ...................... 349/150; 349/152
(58) Field of Classification Search ......... 349/149–152
See application file for complete search history.

(56) References Cited

U.S. PATENT DOCUMENTS

| | | | | |
|---|---|---|---|---|
| 4,767,189 A | * | 8/1988 | Hayashi et al. | 349/149 |
| 5,212,576 A | * | 5/1993 | Yoshioka | 349/149 |
| 6,211,936 B1 | * | 4/2001 | Nakamura | 349/152 |

* cited by examiner

*Primary Examiner*—Toan Ton
(74) *Attorney, Agent, or Firm*—Bacon & Thomas, PLLC

(57) ABSTRACT

A liquid crystal module has a liquid crystal panel and a flexible printed circuit board. The liquid crystal panel has a substrate and an indium tin oxide (ITO) film on the substrate. A flexible printed circuit board has an insulating layer on which a lower conductive layer, a second protective layer, an upper conductive layer and a first protective layer are stacked in sequence. The lower conductive layer is electrically connected to predetermined portions of the lower conductive layer and has a conductive portion, which is unshielded by the insulating layer. The flexible printed circuit board is bonded to the liquid crystal panel with the insulting layer stacked on the indium tin oxide film and the pins of the indium tin oxide film electrically connected to the conductive portion of the lower conductive layer.

3 Claims, 6 Drawing Sheets

LIQUID CRYSTAL MODULE

BACKGROUND OF THE INVENTION

1. Field of the Invention

The present invention relates generally to a liquid crystal module (LCM), and more particularly to a liquid crystal module, which the flexible print circuit (FPC) is bonded to the liquid crystal display (LCD) in a well condition.

2. Description of the Related Art

As shown in FIG. 1 and FIG. 2, a conventional liquid crystal module 1 has a liquid crystal panel 2, a driving integrated circuit (IC) 3 and a flexible printed circuit (FPC) 4. The liquid crystal panel 2 has a glass substrate 2a and a patterned indium tin oxide (ITO) film 2b on a side of the substrate 2a. The ITO film 2b has plural pins 2c adjacent to a margin of the substrate 2a. The driving IC 3 is mounted on the substrate 2a and electrically connected to the ITO film 2b. The FPC 4 has a conductive layer 4a, which is consisted of plural copper wires, and two protective layers 4b and 4c on opposite sides of the conductive layer 4a. As shown in FIG. 2, the conductive layer is electrically connected to the pins 2c at a portion of unshielded by the protective layer 4c.

However, the liquid crystal module is required for smaller size as possible. As shown in FIG. 2, the conventional liquid crystal module 1 has the very short pins 2c (typically they only are 1.0 mm) because of the restriction of the size of the substrate 2a and the pattern of the ITO film 2b. The short pins 2c sometime are fail to be connected to the conductive layer 4a of the FPC 4 firmly. As shown in FIG. 3, while the FPC 4 is bent at where the pins 2c are connected to the conductive layer 4a, the copper wires of the conductive layer 4a sometime are broken because of the stress concentration that makes the FPC 4 not electrically connected to the ITO film 2b.

SUMMARY OF THE INVENTION

The primary objective of the present invention is to provide a liquid crystal module, which the flexible printed circuit board is electrically connected to the ITO film even when the flexible printed circuit board is bent.

The secondary objective of the present invention is to provide a liquid crystal module, which the flexible printed circuit board is electrically connected to the liquid crystal panel in a firm condition.

According to the objectives of the present invention, a liquid crystal module has a liquid crystal panel and a flexible printed circuit board. The liquid crystal panel has a substrate and an indium tin oxide film on the substrate, wherein the indium tin oxide film has a plurality of pins. A flexible printed circuit board has an upper conductive layer, on opposite sides of which a protective layer is attached respectively, a lower conductive layer attached on the protective layer and an insulating layer attached on the lower conductive layer. The lower conductive layer is electrically connected to predetermined portions of the lower conductive layer and has a conductive portion, which is unshielded by the insulating layer. The flexible printed circuit board is bonded to the liquid crystal panel with the insulting layer stacked on the indium tin oxide film and the pins of the indium tin oxide film electrically connected to the conductive portion of the lower conductive layer.

DETAILED DESCRIPTION OF THE INVENTION

Figure 1:
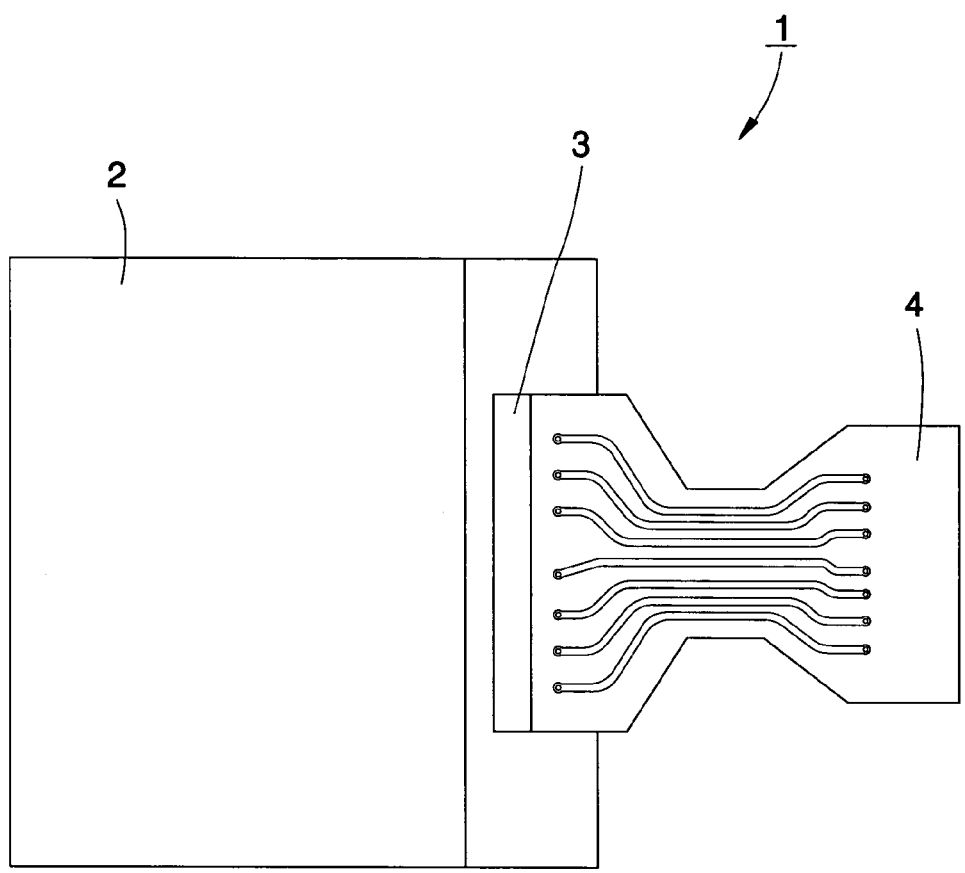
FIG. 1 is a top view of the conventional liquid crystal module.
Figure 2:
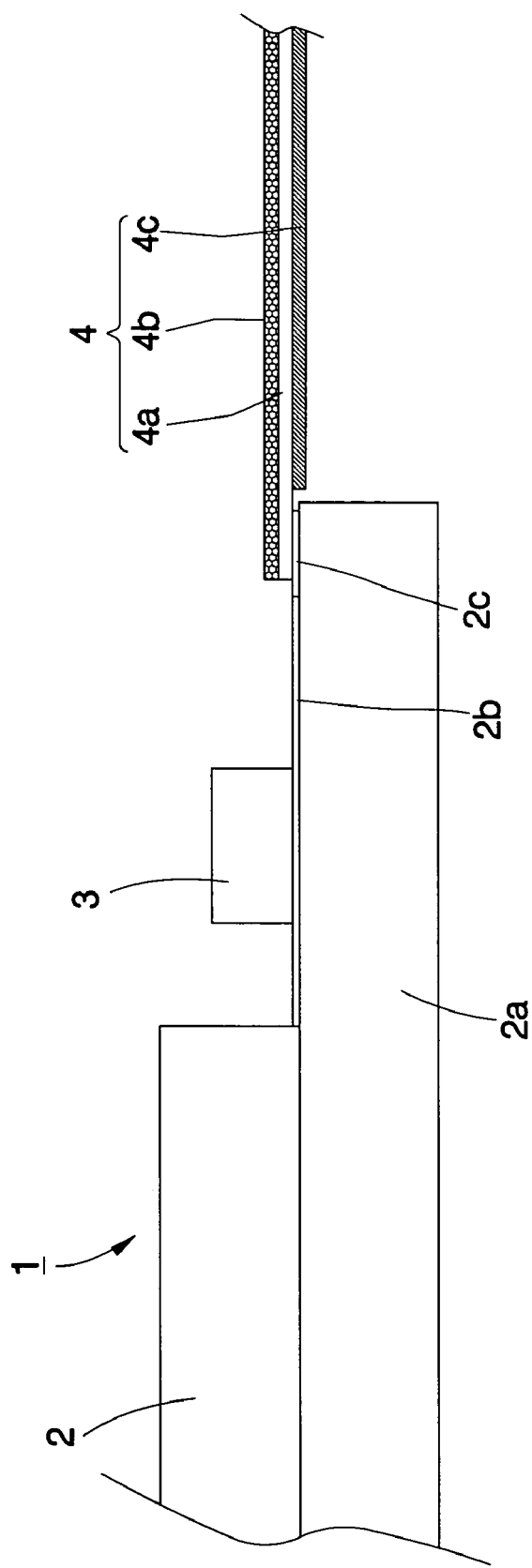
FIG. 2 is a sectional view of the conventional liquid crystal module.
Figure 3:
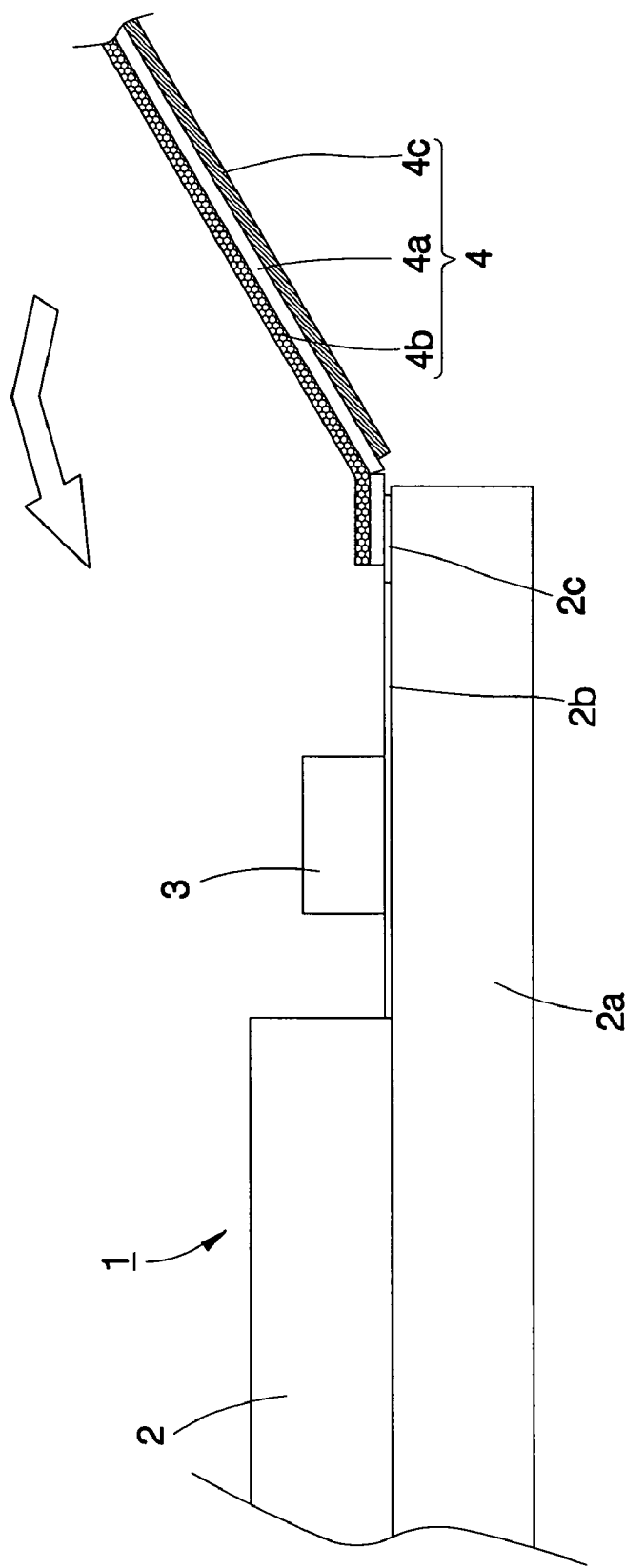
FIG. 3 is a sectional view of the conventional liquid crystal module, showing the flexible printed circuit board being bent.
Figure 4:
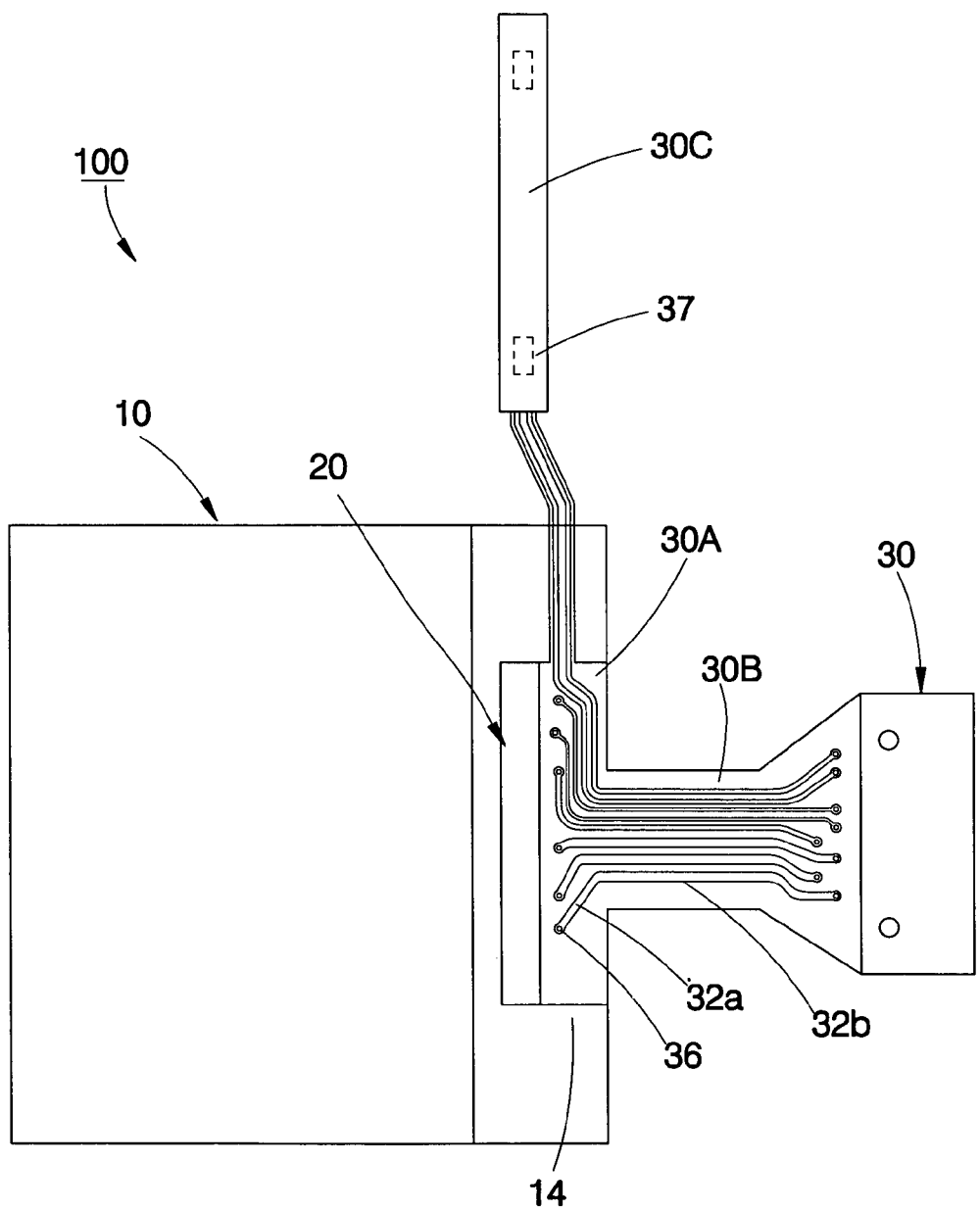
FIG. 4 is a top view of a preferred embodiment of the present invention.
Figure 5:
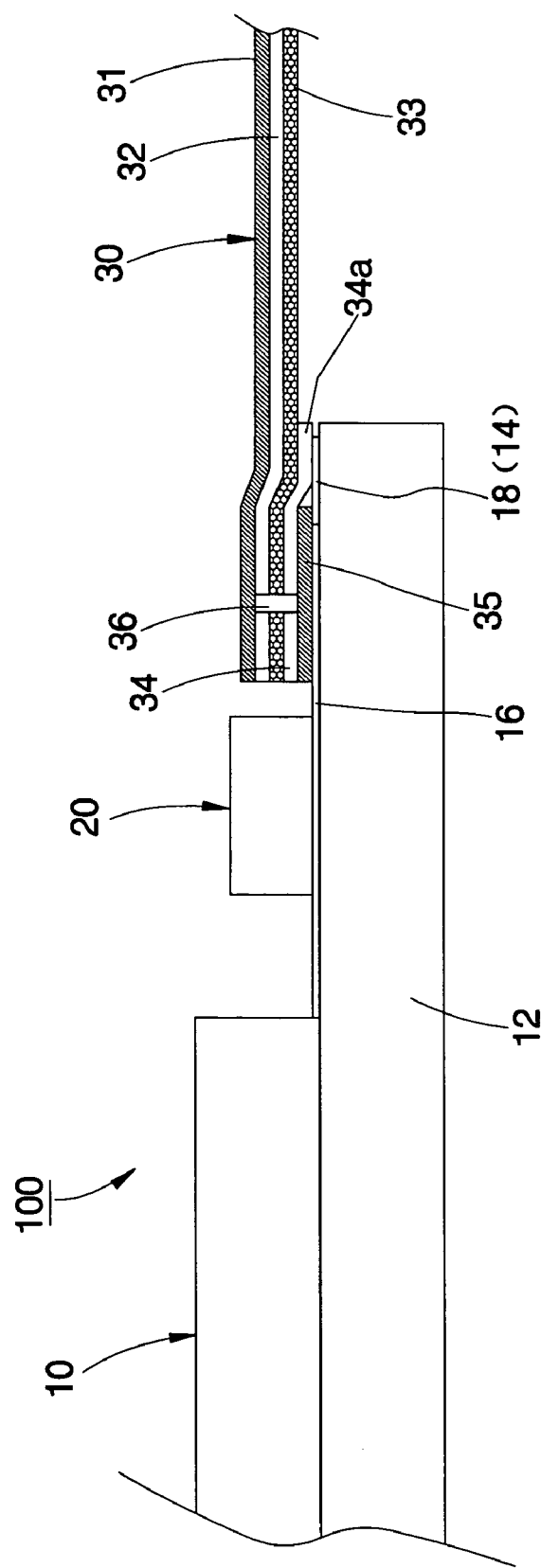
FIG. 5 is a sectional view of the preferred embodiment of the present invention.
Figure 6:
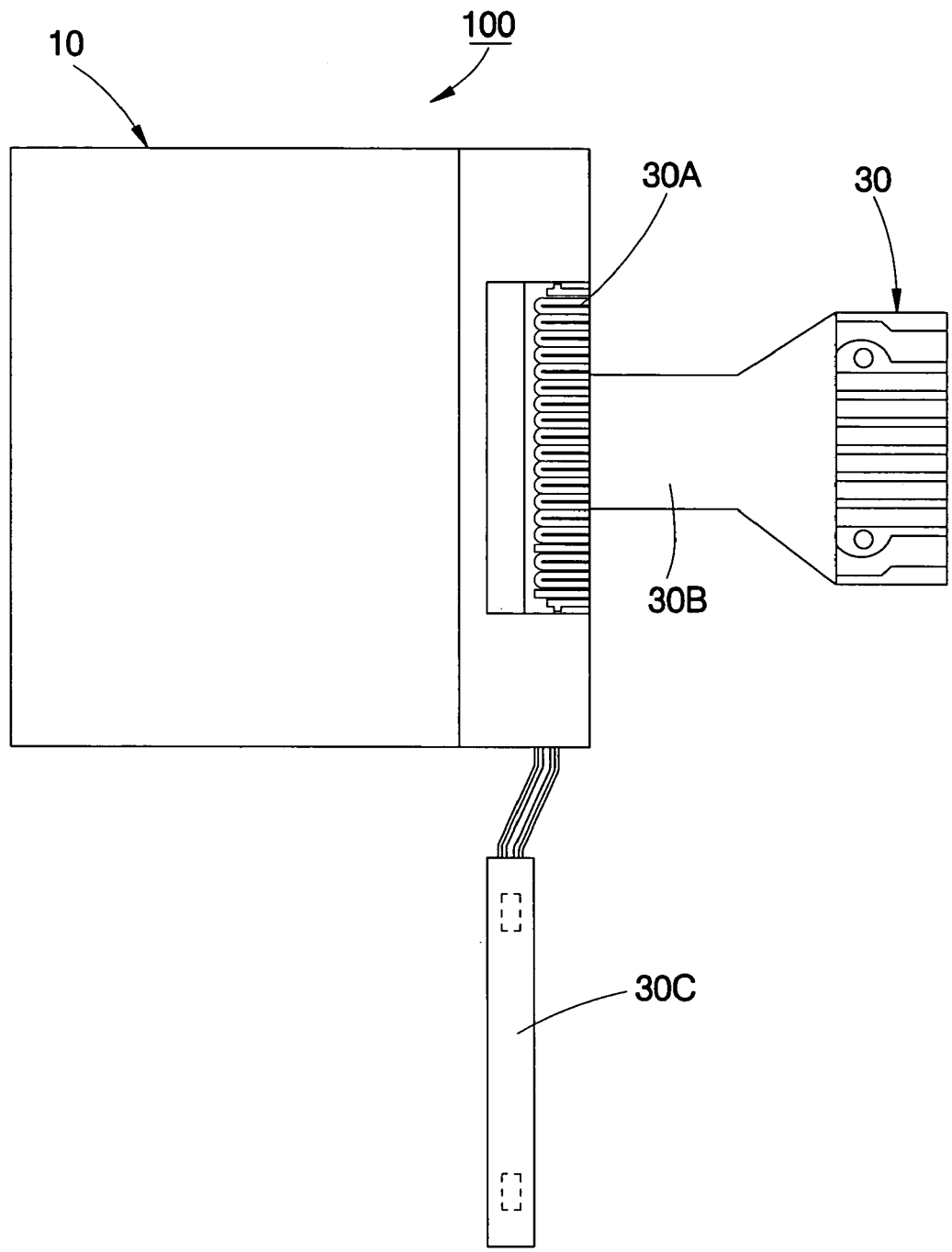
FIG. 6 is a bottom view of the preferred embodiment of the present invention.

As shown in FIG. 4 to FIG. 6, a liquid crystal module 100 of the preferred embodiment of the present invention comprises a liquid crystal panel 10, a driving integrated circuit (IC) 20 and a flexible printed circuit board (FPC) 30.

The liquid crystal panel 10 has a glass substrate 12 with an elongated bonding portion 14 at a margin thereof and a patterned indium tin oxide (ITO) film 16 laminated on the substrate 12. The ITO film 16 has a plurality of pins 18 on the bonding portion 14.

The driving IC 20 is mounted on the substrate 12 and is electrically connected to the ITO film 16. The driving IC 20 provides required voltage to pixels to control the orientations of the liquid crystal.

The FPC 30 has a first protective layer 31 and an upper conductive layer 32, a second protective layer 33, a lower conductive layer 34 and an insulating layer 35 stacked on the first protective layer 31 in sequence. The first and the second protective layers 31 and 33 shield opposite sides of the upper conductive layer 32 for protection of the upper conductive layer 32. The conductive layers 32 and 34 are consisted of a plurality of cooper wires respectively. As shown in FIG. 4, the cooper wires of the upper conductive layer 32 have a curved section 32a and a straight section 32b and the cooper wires of the lower conductive layer 34 are straight, as shown in FIG. 6. The insulating layer 35 only shield a portion of the lower conductive layer 34 and the rest portion, which is unshielded by the insulating layer 35, is defined as a conductive portion 34a, as shown in FIG. 5. The FPC 30 further has plural plated through holes (PTHs) 36 electrically connecting a part of the copper wires of the upper conductive layer 32 and a part of the copper wires of the lower conductive layer 34.

The FPC 30 has a bonding section 30A, an extending section 30B and a connecting section 30C, as shown in FIG. 4. The bonding section 30A and the extending section 30B are a T-shape member. In the bonding section 30A, there are the lower conductive layer 34, the insulating layer 35, the PTHs 36 and the curved section 32a of the copper wires of the upper conductive layer 32. In the extending section 30B, there is the straight section 32b of the copper wires of the upper conductive layer 32. The connecting section 30C is molded to the bonding section 30A as a single unit. As shown in FIG. 4, the copper wires of the upper conductive layer 32, which are not electrically connected to the lower conductive layer 34, are extended to the connecting section 30C to be electrically connected to electrical devices, such as LED.

As shown in FIG. 5, while the FPC 30 is bonded to the liquid crystal panel 10, the insulting layer 35 is stacked on the ITO film 16 and the conductive portion 34a of the lower conductive layer 34 is electrically connected to the pins 18. As a result, the lower conductive layer 34 is isolated from the patterned ITO film 16 to prevent the short. The insulting layer 35 and the conductive portion 34a provide a sufficient space to have the FPC 30 bonded thereon firmly.

In addition, the first and the second protective layers 31 and 33 shield the opposite sides of the upper conductive layer 32, so that the upper conductive layer 32 will not be broken while the FPC 30 is bent.

The FPC 30 of the present invention has the T-shaped bonding section 30A and the extending section 30B that reduces the stress of bending, in other words, the FPC 30 is easier to be bent.

The present invention provides the with a smaller size and keeps the flexible printed circuit board in well conduction with the liquid crystal panel even when the flexible printed circuit board is bent. The scope of the present invention is not restricted in the preferred embodiments only. Any equivalent structure should be in the claim of the present invention.

What is claimed is:

1. A liquid crystal display module, comprising:

A liquid crystal panel having a substrate and an indium tin oxide film on the substrate, wherein the indium tin oxide film has a plurality of pins, and a flexible printed circuit board having a plurality of plated through holes, an upper conductive layer, on opposite sides of which a protective layer is attached respectively, a lower conductive layer attached on the protective layer and an insulating layer attached on the lower conductive layer, the upper conductive layer and the lower conductive layer respectively having a plurality of copper wires, the plated through holes being electrically connected with the predetermined copper wires of the upper conductive layer and the lower conductive layer, and the lower conductive layer being electrically connected to predetermined portions of the lower conductive layer and having a conductive portion, which is unshielded by the insulating layer;

whereby the flexible printed circuit board is bonded to the liquid crystal panel with the insulating layer stacked on the indium tin oxide film and the pins of the indium tin oxide film electrically connected to the conductive portion of the lower conductive layer.

2. The liquid crystal panel as defined in claim 1, wherein the flexible printed circuit board has a bonding section and an extending section and the bonding section has the lower conductive layer, the insulating layer and the plated through holes and the copper wires of the upper conductive layer has a curved section and a straight section and the curved section is located in the bonding section and the straight section is located in the extending section.

3. The liquid crystal panel as defined in claim 2, wherein the flexible printed circuit board further has a connecting section, which is connected to the bonding section, on which the copper wires of the upper conductive layer, which are note electrically connected to the lower conductive layer, are extended.

* * * * *